US006829158B2

(12) United States Patent
Naji

(10) Patent No.: US 6,829,158 B2
(45) Date of Patent: Dec. 7, 2004

(54) MAGNETORESISTIVE LEVEL GENERATOR AND METHOD

(75) Inventor: Peter K. Naji, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 592 days.

(21) Appl. No.: 09/935,269

(22) Filed: Aug. 22, 2001

(65) Prior Publication Data

US 2003/0053331 A1 Mar. 20, 2003

(51) Int. Cl.[7] .............................................. G11C 11/00
(52) U.S. Cl. ...................... 365/158; 365/171; 365/154; 365/173; 365/55; 365/66
(58) Field of Search ................................. 365/158, 154, 365/171, 173, 55, 68

(56) References Cited

U.S. PATENT DOCUMENTS

| | | | | |
|---|---|---|---|---|
| 5,699,293 A | * | 12/1997 | Tehrani et al. ............... | 365/158 |
| 6,055,179 A | * | 4/2000 | Koganei et al. ............. | 365/158 |
| 6,185,143 B1 | | 2/2001 | Perner et al. | |
| 6,205,073 B1 | | 3/2001 | Naji | |
| 6,278,631 B1 | * | 8/2001 | Naji ............................ | 365/158 |
| 6,317,376 B1 | | 11/2001 | Tran et al. | |
| 6,343,032 B1 | * | 1/2002 | Black et al. ................. | 365/158 |
| 6,392,923 B1 | * | 5/2002 | Naji ............................ | 365/158 |
| 6,445,612 B1 | * | 9/2002 | Naji ............................ | 365/158 |
| 6,493,259 B1 | * | 12/2002 | Swanson et al. ............ | 365/158 |
| 6,515,895 B2 | * | 2/2003 | Naji ............................ | 365/171 |
| 2002/0039308 A1 | * | 4/2002 | Gogl et al. .................. | 365/158 |
| 2002/0154539 A1 | * | 10/2002 | Swanson et al. ............ | 365/158 |

FOREIGN PATENT DOCUMENTS

| JP | .11039858 A | * | 2/1999 |
| JP | .411316913 A | * | 11/1999 |
| JP | .02002334585 A | * | 11/2002 |

OTHER PUBLICATIONS

Zhang et al., "Demonstration of a four state sensing scheme for a single pseudo–spin valve gmr bit," IEEE transactions on magnetics, vol. 35, No. 5, Sep. 1999, pp. 2829–2831.

* cited by examiner

Primary Examiner—Viet Q. Nguyen
(74) Attorney, Agent, or Firm—William E. Koch

(57) ABSTRACT

A magnetoresistive multi-level generator including a first series circuit with a first magnetoresistive element having a resistance equal to Rmax connected in series with n first magnetoresistive elements each having a resistance equal to Rmin. Where n is equal to a whole integer greater than one, n additional series circuits, each including an additional magnetoresistive element with a resistance equal to Rmax connected in series with n magnetoresistive elements each with a resistance equal to Rmin. The first and n additional series circuits being connected in series between the input and output terminals and in parallel with each other. Whereby a total resistance between the input and output terminals is a level Rmin+$\Delta$R/n, where $\Delta$R is equal to Rmax–Rmin.

16 Claims, 1 Drawing Sheet

MAGNETORESISTIVE LEVEL GENERATOR AND METHOD

This invention was made with Government support under Agreement No. 4it No. MDA972-96-3-0016 awarded by DARPA. The Government has certain rights in the invention.

FIELD OF THE INVENTION

This invention relates to magnetoresistive devices and more particularly to non-volatile memories, digital to analog converters, analog to digital converters, and other devices requiring one or more different levels (e.g. resistance or voltage) for the generation of output signals.

BACKGROUND OF THE INVENTION

In many devices, such as high density, high speed non-volatile memories, digital to analog converters, analog to digital converters, and other devices requiring one or more different levels (e.g., resistance or voltage) for the generation of output signals, a variety of different levels, resistance or voltage, are generated using complex external or off-chip circuitry. Because the level generators are external and generally very complex, they require extra space and large amounts of power. Thus, the external generators are relatively expensive.

Accordingly it is highly desirable to provide a level generator for memory systems, and other devices requiring a variety of levels for the generation of output signals.

BRIEF DESCRIPTION OF THE DRAWINGS

Referring to the drawings.

DESCRIPTION OF THE PREFERRED EMBODIMENTS

A magnetoresistive element can be viewed as a resistor with two states. The two states are Rmin and Rmax, where Rmin is the minimum value of the resistance of the element corresponding to parallel states of magnetization and Rmax is the maximum value of the resistance of the element corresponding to anti-parallel states of magnetization. The magnetoresistive elements described and utilized herein can be any of the well known types including magnetic tunneling junction (MTJ), giant magnetoresistive (GMR), AMR, etc. Examples of MRAMs of each of these types are described in the patents set forth below, all of which are incorporated herein by reference. U.S. Pat. No. 5,702,831, entitled "Ferromagnetic GMR Material", issued Dec. 30, 1997; U.S. Pat. No. 5,732,016, entitled "Memory Cell Structure in a Magnetic Random Access Memory and a Method for Fabricating Thereof", issued Mar. 24, 1998; and U.S. Pat. No. 5,702,831, entitled "Multi-Layer Magnetic Tunneling Junction Memory Cells", issued Mar. 31, 1998.

Figure 1:
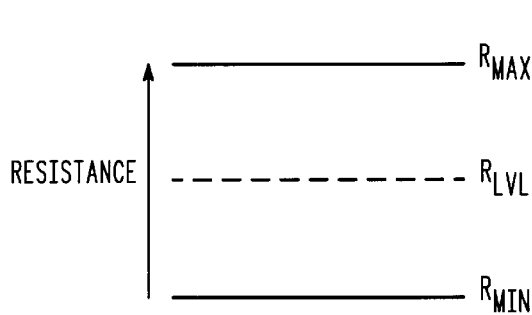
FIG. 1 is a simplified schematic diagram of a single level generator in accordance with the present invention.

It is a purpose of this disclosure to utilize magnetoresistive elements to generate a level resistance, which is at some predetermined level (e.g. ½, ⅓, ¼, etc.) between Rmin and Rmax and, accordingly, apparatus is disclosed herein for generating the levels. Turning now to FIG. 1, a graphical representation is illustrated of the relationship of various resistances discussed. In this representation, Rmin is illustrated as a lower resistance line with Rmax being illustrated as a higher resistance line spaced some distance from Rmin. A resistance at some level between Rmin and Rmax is designated $R_{1vl}$ (where the level is equal to ½, ⅓, ¼, etc.). The following equation describes the relationship of $R_{1vl}$ (where the level is equal to ½) to Rmin and Rmax:

$$R_{1vl}=(Rmax-Rmin)/2+Rmin$$

$$R_{1vl}=\Delta R/2+Rmin \qquad (1)$$

where $\Delta R = Rmax - Rmin$

Figure 2:
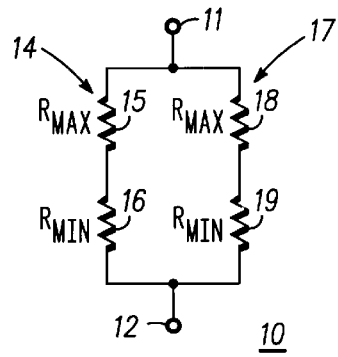
FIG. 2 is a schematic diagram of another embodiment of a single level generator in accordance with the present invention.

Equation (1) is implemented by a series/parallel combination of magnetoresistive elements as illustrated in FIG. 2, which generates a ½ level. Magnetoresistive elements can be combined in this manner because they are linear elements to the first order and, therefore, they can be treated as ordinary passive linear resistors. Generator 10 includes an input terminal 11 and an output terminal 12. A series circuit 14 includes a magnetoresistive element 15, with a resistance equal to Rmax, connected in series with a magnetoresistive element 16, with a resistance equal to Rmin, connected in series between input terminal 11 and output terminal 12. Another series circuit 17 includes a magnetoresistive element 18, with a resistance equal to Rmax, connected in series with a magnetoresistive element 19, with a resistance equal to Rmin, connected in series between input terminal 11 and output terminal 12. Series circuit 14 is also connected in parallel with series circuit 17 to form the series/parallel combination.

The series/parallel combination of resistances of generator 10 are combined as follows:

$$R_{AB}=(Rmax+Rmin)\|(Rmax+Rmin)$$

where $R_{AB}$ is the total resistance between input terminal 11 and output terminal 12.

$$\begin{aligned}R_{AB} &= (Rmax+Rmin)^2/2(Rmax+Rmin) \qquad (2)\\ &= (Rmax+Rmin)/2\\ &= (\Delta R + Rmin + Rmin)/2\\ R_{AB} &= \Delta R/2 + Rmin\end{aligned}$$

It can be seen that equation (2) is equal to equation (1), i.e. $R_{AB}$ is equal to $R_{1vl}$ and generator 10 successfully generates the level ½.

In general, magnetoresistive elements are non-volatile memory elements which can be programmed into an Rmax or an Rmin state, where Rmin is a minimum resistive value corresponding to parallel states of magnetization and Rmax is a maximum resistive value corresponding to anti-parallel states of magnetization. Further, magnetoresistive elements are generally initially in the Rmin state and must be programmed into the Rmax state prior to the generation of $R_{1vl}$. This programming can be done as a one time effort and, thereafter, Rmax is generated automatically without any need to reprogram, since the magnetoresistive elements hold their magnetization state in a non volatile fashion.

Figure 3:
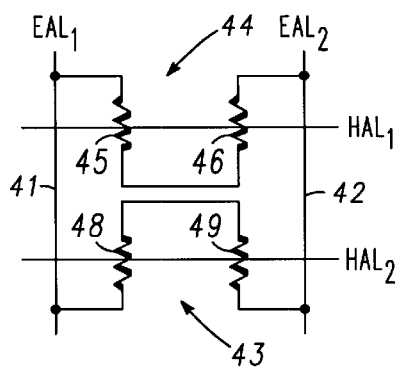
FIG. 3 is a schematic diagram of an embodiment of a multi-level generator in accordance with the present invention.

Turning now to FIG. 3, an embodiment of a magnetoresistive single level generator 40 is illustrated. Generator 40 includes an easy axis line 41 (which serves as an input terminal for generator 40) and an easy axis line 42 (which serves as an output terminal for generator 40). A series circuit 44 includes a magnetoresistive element 45 connected in series with a magnetoresistive element 46. Series circuit 44 is connected in series between easy axis line 41 and easy axis line 42. Another series circuit 47 includes a magnetoresistive element 48 connected in series with a magnetoresistive element 49. Series circuit 47 is connected in series between an easy axis line 41 and easy axis line 42. Easy axis line 41 is magnetically associated with elements 45 and 48 and easy axis line 42 is magnetically associated with elements 46 and 49. Easy axis lines 41 and 42 connect series circuit 44 in parallel with series circuit 47 to form the series/parallel combination. A hard axis line HAL1 is magnetically associated with magnetoresistive elements 45 and 46 and a hard axis line HAL2 is magnetically associated with magnetoresistive elements 48 and 49 to provide programming current in conjunction with easy axis lines 41 and 42.

Assuming for example that all magnetoresistive elements 45, 46, 48, and 49 are MTJS, elements 45 and 48 are programmed into the Rmax state by utilizing the following steps. It will of course be understood from the following that elements 46 and 49 could alternatively be programmed into the Rmax state, if desired. In a first step, an easy axis current flows through line 41 (generally from top to bottom) and, simultaneously, a hard axis current flows through hard axis line HAL1, while no current flows through HAL2. The magnetic fields produced by this current flow are combined at element 45 where they will change the state of element 45 from Rmin to Rmax. During this programming, line 42 is an open circuit.

In a second step, easy axis current continues to flow through line 41 (generally from top to bottom). Line 42 remains an open circuit. Hard axis current is stopped in hard axis line HAL1 and started in hard axis line HAL2. The magnetic fields produced by this current flow are combined at element 48 where they will change the state of element 48 from Rmin to Rmax. Once programming is complete, line 42 is reconnected or closed, and generator 40 provides $R_{1vl}$ between line 41 and line 42.

Additional embodiments and methods of construction are disclosed in a copending application entitled "Magnetoresistive Midpoint Generator and Method", bearing Ser. No. 09/793,163, filed Feb. 27, 2001, assigned to the same assignee, and incorporated herein by reference.

Figure 4:
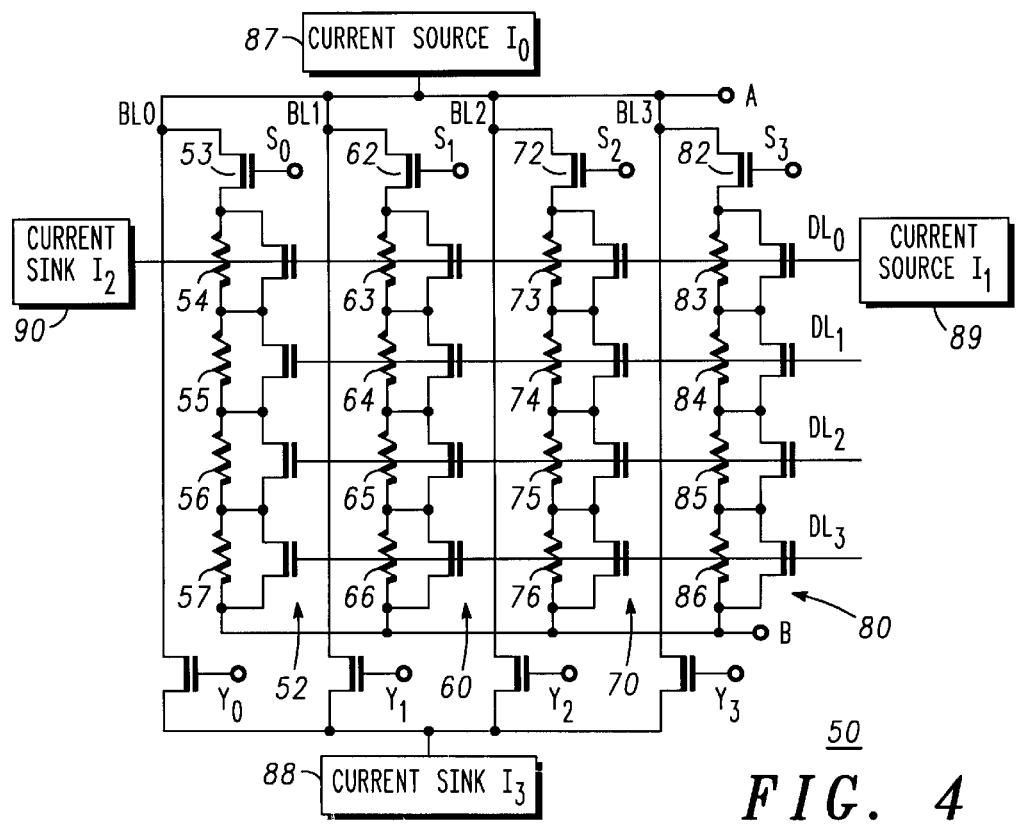
FIG. 4 is a schematic diagram of another embodiment of a multi-level generator in accordance with the present invention

Turning now to FIG. 4, a simplified schematic diagram of multi-level generator 50 is illustrated. In this embodiment, for purposes of example only, the circuitry is constructed to generate any of three different levels including a level Rmin+$\Delta$R/2, a level Rmin+$\Delta$R/3, and a level Rmin+$\Delta$R/4. It will be understood, however, that any desired number of levels n (where n is a whole integer greater than one) can be generated by simply extending the disclosed embodiment to generate any level Rmin+$\Delta$R/n.

Generator 50 includes a first series circuit 52, with a first select transistor 53, a magnetoresistive element 54 having a resistance equal to Rmax and three magnetoresistive elements 55, 56, and 57 each having a resistance equal to Rmin, connected in series between an input terminal A and an output terminal B. A second series circuit 60, includes a second select transistor 62, a second magnetoresistive element 63 having a resistance equal to Rmax and three magnetoresistive elements 64, 65, and 66 each having a resistance equal to Rmin. Second series circuit 60 is connected in series between input terminal A and output terminal B and in parallel with first series circuit 52. A third series circuit 70, includes a third select transistor 72, a third magnetoresistive element 73 having a resistance equal to Rmax and three magnetoresistive elements 74, 75, and 76 each having a resistance equal to Rmin. Third series circuit 70 is connected in series between input terminal A and output terminal B and in parallel with series circuits 52 and 60. A fourth series circuit 80, includes a fourth select transistor 82, a fourth magnetoresistive element 83 having a resistance equal to Rmax and three magnetoresistive elements 84, 85, and 86 each having a resistance equal to Rmin. Fourth series circuit 80 is connected in series between input terminal A and output terminal B and in parallel with series circuits 52, 60, and 70. Here it should be understood that the magnetoresistive element having a resistance equal to Rmax is illustrated as the upper element in each series circuit 52, 60, 70 and 80 for convenience of explanation, but any one of the elements in each of the series circuits could be set to Rmax, as desired.

Each of the magnetoresistive elements in first, second, third, and fourth series circuits 52, 60, 70, and 80, respectively, include a parallel connected control transistor. Each parallel connected control transistor is connected in parallel across the magnetoresistive element so that the magnetoresistive element is in the circuit when the parallel connected control transistor is nonconducting and is shorted, or out of the circuit, when the parallel connected control transistor is conducting. Circuitry for operating the select transistors includes terminals $S_0$ through $S_3$, connected to the gates of select transistors 53, 62, 72, and 82, respectively. Circuitry for operating the parallel connected control transistors includes digit lines $DL_0$ through $DL_3$. Digit line $DL_0$ is connected to the gates of parallel connected control transistors in parallel with magnetoresistive elements 54, 63, 73, and 83. Digit line $DL_1$ is connected to the gates of parallel connected control transistors in parallel with magnetoresistive elements 55, 64, 74, and 84. Digit line $DL_2$ is connected to the gates of parallel connected control transistors in parallel with magnetoresistive elements 56, 65, 75, and 85. Digit line $DL_3$ is connected to the gates of parallel connected control transistors in parallel with magnetoresistive elements 57, 66, 76, and 86. Each digitline $DL_0$ through $DL_3$ provides easy axis programming current for the magnetoresistive elements in series circuits 52, 60, 70, and 80, respectively.

Also, for purposes of the original programming of generator 50, bitlines $BL_0$ through $BL_3$ are magnetically associated, one each with each magnetoresistive element 54, 63, 73, and 83, respectively. Each bitline $BL_0$ through $BL_3$ has a column select transistor $Y_0$ through $Y_3$ connected in series. A current source 87 is connected to the upper ends of each of the bitlines $BL_0$ through $BL_3$ and a current sink 88 is connected to the lower ends of each of the bitlines $BL_0$ through $BL_3$. Each bitline $BL_0$ through $BL_3$ provides hard axis programming current for the magnetoresistive elements in series circuits 52, 60, 70, and 80, respectively. Also a current source 89 and a current sink 90 are connected to opposite ends of digitline $DL_0$. Initially, magnetoresistive element 54, 63, 73, and 83 have to be programmed to the Rmax state. Since magnetoresistive elements are normally in the Rmin state, the remaining magnetoresistive elements are not programmed.

To program magnetoresistive element 54, 63, 73, and 83 to the Rmax state, a logic zero signal is applied to terminals $S_0$ through $S_3$, current sources and sinks 87, 88, 89 and 90 are turned on, and column select transistors $Y_0$ through $Y_3$ are sequentially turned on. Thus, at the intersection of $DL_0$ and $BL_0$, magnetoresistive element 54 is programmed to a Rmax state when column select transistors $Y_0$ is turned on. Similarly, at the intersection of $DL_1$ and $BL_1$, magnetoresistive element 63 is programmed to a Rmax state when column select transistors $Y_1$ is turned on, at the intersection of $DL_2$ and $BL_2$, magnetoresistive element 73 is programmed to a Rmax state when column select transistors $Y_2$ is turned on, and at the intersection of $DL_3$ and $BL_3$, magnetoresistive element 83 is programmed to a Rmax state when column select transistors $Y_3$ is turned on. Once this programming is complete, multi-level generator 50 is ready for operation and programming does not have to be repeated again.

In the exercise or evaluation mode of operation for multi-level generator 50, $Y_0$ through $Y_3$ are set equal to a logic zero and current sources and sinks 87, 88, 89, and 90 are turned off. To generate a level $R_{AB}$ equal to Rmin+$\Delta$R/4 (N=4), set $S_0=S_1=S_2=S_3=$a logic one and $DL_0=DL_1=DL_2=DL_3=$a logic zero. To generate a level $R_{AB}$ equal to Rmin+$\Delta$R/3 (N=3), set $S_0=S_1=S_2=$a logic one, $S_3=$a logic zero, $DL_0=DL_1=DL_2=$a logic zero, and $DL_3=$a logic one. To generate a level $R_{AB}$ equal to Rmin+$\Delta$R/2 (N=2), set $S_0=S_1=$a logic one, $S_2=S_3=$a logic zero, $DL_0=DL_1=$a logic zero, and $DL_2=DL_3=$a logic one.

Programming and the exercise or evaluation mode of operation will proceed in a similar fashion for multi-level generators including n additional series magnetoresistive elements and n additional columns of series circuits. Basically, by following the above teachings, any size array can be made to produce a predetermined level. Further, it will be understood that an array (level generator) can be fabricated to produce only a single predetermined level or, as described above, can be controlled to produce a variety of different levels.

In general, it is desirable to make the width of the select and control n-channel transistors (e.g. 53, 62, 72, 82 and the control transistors) very large and the lengths very small in order to minimize their resistance, which will affect $R_{AB}$, especially when $R_{AB}$ is equal to Rmin+$\Delta$R/2.

When dealing with magnetoresistive elements, it is understood that resistance of an element (i.e., both Rmin and Rmax, as well as the level) can be changed by changing the size, shape, structure and material. However, in the preferred embodiment the disclosed level generator will generally be fabricated on a common substrate with the circuitry utilizing the level generator. Generally, this circuitry includes magnetoresistive elements. A major advantage of the disclosed level generator is that the magnetoresistive elements included therein are fabricated the same (e.g. the same size, shape, structure and material) as the magnetoresistive elements incorporated into the circuitry utilizing the level generator. Thus, no special manufacturing steps or techniques are required.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A magnetoresistive level generator including a plurality of non-volatile magnetoresistive elements each having an Rmax state and an Rmin state and each being set to one of Rmax and Rmin and the plurality of non-volatile magnetoresistive elements being connected together to provide a total resistance at a predetermined resistance level between Rmax and Rmin.

2. A magnetoresistive level generator as claimed in claim 1 wherein the predetermined resistance level is one of (Rmax−Rmin)/2+Rmin, (Rmax−Rmin)/3+Rmin, and (Rmax−Rmin)/4+Rmin, .

3. A magnetoresistive level generator as claimed in claim 1 wherein circuitry utilizing the predetermined resistance level includes additional non-volatile magnetoresistive elements, the non-volatile magnetoresistive elements included in the level generator and the additional non-volatile magnetoresistive elements being substantially similar in size, shape, structure, and material.

4. A magnetoresistive level generator as claimed in claim 3 wherein the non-volatile magnetoresistive elements and circuitry utilizing the predetermined resistance level are fabricated on a common substrate.

5. A magnetoresistive level generator comprising:
an input terminal and an output terminal;
a first series circuit including a first magnetoresistive element with a resistance equal to Rmax connected in series with n first magnetoresistive elements each with a resistance equal to Rmin, the first series circuit connected in series between the input terminal and the output terminal; and
n additional series circuits, each including an additional magnetoresistive element with a resistance equal to Rmax connected in series with n magnetoresistive elements each with a resistance equal to Rmin, the n additional series circuits being connected in series between the input terminal and the output terminal and in parallel with the first series circuit, where n is equal to a whole integer greater than one, whereby a total resistance between the input terminal and the output terminal is a level Rmin+$\Delta$R/n, where $\Delta$R is equal to Rmax−Rmin.

6. A magnetoresistive level generator as claimed in claim 5 wherein the first and n additional magnetoresistive elements in each of the first and n additional series circuits each include a non-volatile magnetoresistive element.

7. A magnetoresistive level generator as claimed in claim 5 wherein each of the magnetoresistive elements has an Rmax and an Rmin state, where Rmin is a minimum resistive value corresponding to parallel states of magnetization and Rmax is a maximum resistive value corresponding to anti-parallel states of magnetization.

8. A magnetoresistive level generator as claimed in claim 5 including n+1 easy axis lines, one each magnetically associated with each of the first and n additional series circuits for receiving programming current for programming the first magnetoresistive element with the resistance equal to Rmax in the first series circuit and the additional magnetoresistive elements with the resistance equal to Rmax in each of the n additional series circuits with the resistance equal to Rmax.

9. A magnetoresistive level generator as claimed in claim 8 further including a hard axis line magnetically associated with each of the first magnetoresistive element with the resistance equal to Rmax in the first series circuit and the n additional magnetoresistive element with the resistance equal to Rmax in the n additional series circuits for receiving programming current.

10. A magnetoresistive level generator as claimed in claim 5 wherein the magnetoresistive elements in each of the first and n additional series circuits each include a magnetic tunneling junction magnetoresistive element.

11. A magnetoresistive level generator as claimed in claim 5 wherein the magnetoresistive elements in each of the first and n additional series circuits each include a switching transistor in parallel with the magnetoresistive element.

12. A magnetoresistive level generator as claimed in claim 5 including a first select transistor connected in series with the magnetoresistive elements in the first series circuit and n additional select transistors, one each connected in series with the magnetoresistive elements in the n additional series circuits.

13. A magnetoresistive multi-level generator comprising:

an input terminal and an output terminal;

a first series circuit, including a first select transistor, a first magnetoresistive element having a resistance equal to Rmax and n magnetoresistive elements each having a resistance equal to Rmin, connected in series between the input terminal and the output terminal;

n additional series circuits, each including a select transistor, an additional magnetoresistive element having a resistance equal to Rmax and n magnetoresistive elements each having a resistance equal to Rmin, connected in series between the input terminal and the output terminal, and each additional series circuit being connected in parallel with the first series circuit, where n is equal to a whole integer greater than one;

each of the magnetoresistive elements in the first and n additional series circuits including a parallel connected control transistor; and circuitry for operating the select and control transistors into one of conducting and nonconducting states, whereby a total resistance between the input terminal and the output terminal is a level Rmin+$\Delta$R/n, where $\Delta$R is equal to Rmax−Rmin.

14. A magnetoresistive multi-level generator as claimed in claim 13 wherein the magnetoresistive elements in each of the first and n additional series circuits each include a magnetic tunneling junction magnetoresistive element.

15. A magnetoresistive multi-level generator comprising:

an input terminal and an output terminal;

a first series circuit, including a first select transistor, a first magnetoresistive element having a resistance equal to Rmax and three magnetoresistive elements each having a resistance equal to Rmin, connected in series between the input terminal and the output terminal;

a second series circuit, including a second select transistor, a second magnetoresistive element having a resistance equal to Rmax and three magnetoresistive elements each having a resistance equal to Rmin, connected in series between the input terminal and the output terminal and in parallel with the first series circuit;

a third series circuit, including a third select transistor, a third magnetoresistive element having a resistance equal to Rmax and three magnetoresistive elements each having a resistance equal to Rmin, connected in series between the input terminal and the output terminal and in parallel with the first series circuit;

a fourth series circuit, including a fourth select transistor, a fourth magnetoresistive element having a resistance equal to Rmax and three magnetoresistive elements each having a resistance equal to Rmin, connected in series between the input terminal and the output terminal and in parallel with the first series circuit;

each of the magnetoresistive elements in the first, second, third, and fourth series circuits including a parallel connected control transistor; and circuitry for operating the select and control transistors into one of conducting and nonconducting states, whereby a total resistance between the input terminal and the output terminal is a level Rmin+$\Delta$R/n, where $\Delta$R is equal to Rmax−Rmin and n is equal to one of 2, 3, and 4.

16. A magnetoresistive multi-level generator as claimed in claim 15 wherein the magnetoresistive elements in each of the first, second, third, and fourth series circuits each include a magnetic tunneling junction magnetoresistive element.

* * * * *